June 14, 1966 K. NEUBER ETAL 3,256,469

TRANSISTOR ASSEMBLY IN A HEAT DISSIPATING CASING

Filed Sept. 29, 1960

Inventors:
KARL NEUBER
GÜNTHER HEISE

By Toulmin & Toulmin
Attorneys

United States Patent Office 3,256,469
Patented June 14, 1966

3,256,469
TRANSISTOR ASSEMBLY IN A HEAT DISSIPATING CASING

Karl Neuber, Ulm-Wiblingen, and Günther Heise, Ulm, Germany, assignors to Telefunken A.G., Hanover, Germany Filed Sept. 29, 1960, Ser. No. 59,441
Claims priority, application Germany, Sept. 30, 1959, T 17,280
10 Claims. (Cl. 317—235)

The present invention relates to transistors, more particularly, to a transistor having improved heat-conductive properties between the heat-conductive carrier plate and the casing and to a method of forming this transistor.

The conventional transistor construction comprises a semiconductive body which is mounted on a carrier plate which plate provides a mechanical support or base for the transistor. In high-power transistors, the carrier plate is also utilized to conduct heat that is developed in the semiconductive body. This carrier plate also functions as a heat-conductive carrier member. The term "base cooling" is sometimes employed to describe the carrying off of the heat energy developed by the semiconductor body through the heat-conductive carrier plate to the wall of the transistor casing. This base cooling effect can generally be improved by connecting a cooling cylinder directly with the carrier plate such as by welding.

It has been found, however, that an effective cooling of the transistor depends primarily on the quantity of air which remains between the heat-conductive carrier and the inner wall of the casing because of the tolerances between the carrier and the casing wall. In manufacturing the transistor, however, considerable difficulty is encountered in accurately dimensioning the interior diameter of the casing with respect to dimensions of the heat-conductive carrier so as to provide a desired air space therebetween. The heat-conductive carrier may comprise only the carrier plate or may additionally comprise a cooling cylinder, as described above.

This difficulty in manufacture is considerably magnified if the casing comprises glass because the tolerances of the inner diameter in the production of glass capsules are far greater than in the production of for instance metal capsules. Therefore, the poor heat-conductive properties of air prevent an efficient and always equal transmission of heat between the carrier member and the glass capsule. Due to the change in tolerances difficulty arises in accurately dimensioning the carrier plate with respect to the glass casing.

In order to eliminate the above described disadvantages and to improve the heat-conductive relationship between the carrier plate and the casing the present invention proposes to provide a material which is plastic at room temperatures between the heat-conductive carrier member and the wall of the casing. This material will closely conform to the carrier member and inner casing surfaces and accordingly will establish a good heat-conductive relationship between these two components. Thus this invention provides for the optimum transmission of heat from the heat-conductive carrier member to the transistor casing. Further, effective cooling can be obtained even without employing an additional cooling cylinder.

It is, therefore, the principal object of this invention to provide a novel and improved transistor arrangement and a method of forming the same.

It is another object of this invention to provide a transistor having improved cooling characteristics.

It is a further object of this invention to provide a transistor wherein the heat-conductive carrier plate is so mounted in the transistor casing that a good heat-conductive relationship is established between the carrier plate and the casing.

Other objects and advantages of this invention will become apparent upon reference to the accompanying description when taken in conjunction with the following drawings, wherein.

Figure 1:
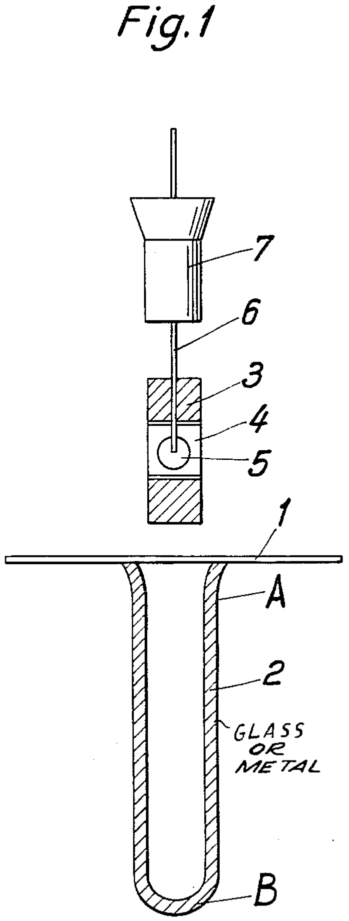
FIGURE 1 is an elevational view with the transistor casing being shown in section and illustrating the manner in which the metallic strip is initially positioned on the open end of the casing prior to insertion of the carrier plate into the casing.

Proceeding next to the drawings wherein like reference symbols indicate the same parts throughout the various views a specific embodiment of this invention will be described. With particular reference to FIGURE 1 there is illustrated a metal strip 1 consisting of indium which is placed on the open end A of transistor casing 2. The other end B of the transistor casing is closed. The indium strip has a length of approximately 18 millimeters, a width of 2 millimeters and a thickness of 0.45 millimeter. The flat side of the strip or the width thereof is positioned on the open end A of the transistor casing 2.

The casing 2 comprises a glass tube having an interior diameter ranging from 3.4 to 3.6 millimeters.

The transistor assembly comprises a heat-conductive carrier plate 3 in which is mounted the transistor proper comprising a semiconductive body 4 carrying two alloyed pellets on opposite sides thereof, only the pellet 5 being visible on the drawings. Connected with this pellet 5 is an external lead wire 6 which is mounted in a post or plug 7 used to close the open end of the transistor casing. The same is the case with the emitter electrode on the other side.

Figure 2:
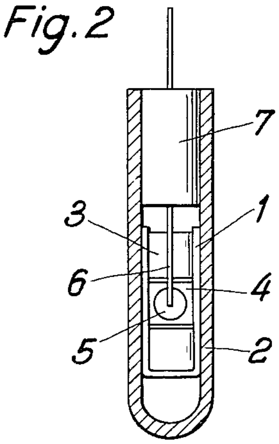
FIGURE 2 is a view similar to that of FIGURE 1 but showing the carrier plate and the metallic strip in assembly relationship within the casing.

In assembling the transistor of this invention the components are positioned in relationship as illustrated in FIGURE 1. The conductor plate is then pushed against the indium strip 1 so that the conductor plate assembly and the strip are inserted into the casing 2 into the position as illustrated in FIGURE 2. This will cause the strip 1 to fold around the narrow edge of the conductor plate 3 and accordingly the strip will provide a close fit between the conductor plate and the wall of the casing. The plug 7 is then fused or melted so as to close the fit within the casing 2 to complete the heat-conductive transistor.

The length of the indium strip is preferably so chosen that the maximum contact surface is provided between the strip and the narrow edge of the carrier plate.

If the casing 2 comprises glass, it is preferable to heat the indium strip after inserting into the casing so that the indium will melt and will further improve the heat transmission. The process of melting indium in the case of glass casing takes place when the open end of the glass is sealed and, therefore, not a special heating process is necessary. Since the indium has a melting point of 155° C. it can be seen that only little heating thereof is required. Upon cooling of the softened indium strip the strip will closely conform to any variations in the inner surface of the casing 2. This will provide a good heat-conductive relationship between the conductive plate 3 and the casing 2.

An alternative method of assembly comprises initially wrapping the indium strip 1 around an edge of the rectangular carrier plate 3 and subsequently forcing the carrier plate and indium strip assembly into the casing which may be either metal or glass. Thus any variations in the interior diameter of the glass or metal casing are compensated by the relatively soft indium being deformed so as to closely contact both the narrow edge of the carrier plate and the interior wall of the casing 2. This will provide an effective metallic contact between the carrier plate and the casing without the necessity of accurately dimensioning the carrier plate with respect to the internal diameter of the casing. Therefore, this structure will greatly reduce the variations of the heat-conductive properties of various transistors. Further, the semiconductor body and carrier plate assembly are firmly mounted within the casing and are, therefore, protected against shocks and vibrations.

This invention including the embodiment as described above may be employed for nearly all types of transistors and diodes.

Figure 3:
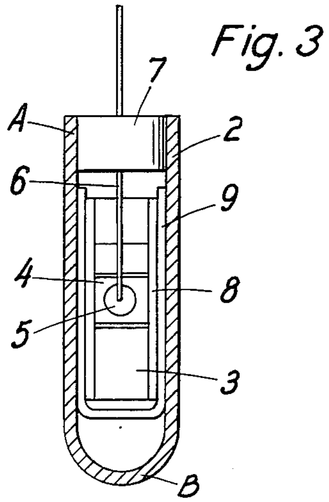
FIGURE 3 is a vertical sectional view of another embodiment of this invention wherein the carrier member comprises a cooling cylinder, open at both ends, mounted on the carrier plate.

Another embodiment of this invention is illustrated in FIGURE 3 wherein a cooling cylinder 8 open at both ends is mounted on the carrier plate 3. The hollow cooling cylinder is employed to obtain a good heat exchange relationship between the cooling cylinder and the carrier plate. This can be accomplished by employing a shrink-fit between the hollow cylinder and the carrier plate. In addition, the carrier plate may be welded or soldered to the hollow cylinder. Also, spot-welds may be used to join the carrier plate to one end of the cylinder.

Since it is difficult to accurately dimension the exterior of the cooling cylinder with respect to the casing 2 so as to obtain a good heat-conductive relationship therebetween, the present invention introduces a plastic metal 9 between the cooling cylinder 8 and the casing 2. This material is plastic at room temperatures and is extremely ductile. This material may comprise an alloy of tin and indium which has a melting point of about 117 to 120° C. and is susceptible to soft soldering. This will produce a good connection and a close fit between cooling cylinder 8 and the casing 2.

Figure 4:
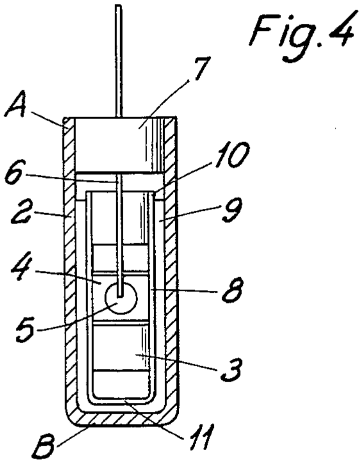
FIGURE 4 is a vertical sectional view of the same embodiment of this invention wherein the carrier member comprises a cooling cylinder, closed at one end, mounted on the carrier plate.

In FIGURE 4 is shown a cooling cylinder closed at the bottom end 11 and open at the upper end 10.

This embodiment of the transistor can be assembled in the following manner: A predetermined amount of the soft metalis placed into the closed end B of the capsule 2. In this embodiment the capsule 2 is of metal. The casing 2 is then positioned with its open end A in the uppermost position and the closed end of the casing is heated to a temperature of about 130 to 140° C. if the tin-indium-alloy has a melting point of about 117 to 120° C. The closed end 11 of the cooling cylinder is also heated to a temperature of about 130° C., preferably in a furnace and a dry oxygen atmosphere. Subsequently, the cooling cylinder is rapidly inserted with its closed end downwardly into the casing 2. The cooling cylinder will then displace the liquid tin-indium-alloy 9 in the casing so that the liquid alloy will flow upwardly between the walls of the cylinder and the casing to provide a good heat-conductive bond between the cooling cylinder and the casing in the manner as illustrated in FIGURE 4.

The amount of alloy which is initially placed in the capsule is so calculated as to fill the space between the cooling cylinder and the casing when the cylinder has been placed within the casing in the position as shown in FIGURE 4.

Thus it can be shown that the present invention comprises a simple yet effective transistor having improved cooling characteristics together with a method for rapidly constructing such a transistor. While specific materials have been mentioned in connection with the various elements of the transistor, the casing may be formed of other materials such as glass, ceramics, metals or any other suitable materials developed for this purpose.

It will be understood that this invention is susceptible to modification in order to adapt it to different usages and conditions and, accordingly, it is desired to comprehend such modifications within this invention as may fall within the scope of the appended claims.

What we claim is:

1. A transistor assembly comprising in combination: a casing; a heat-conductive carrier base within said casing; a transistor having a semiconductor body constituting one transistor region and at least two electrodes carried on respective opposite sides of said semiconductor body and constituting two other transistor regions, said transistor being mounted in said base so that said base directly contacts said semiconductor body and is isolated from said electrodes, and a heat-conductive material which remains plastic at room temperatures positioned between said casing and said base for conducting heat generated in said semiconductor body from said base to said casing.

2. A transistor assembly comprising in combination: a casing; a heat-conductive carrier member within said casing, said carrier member comprising a carrier plate and a cooling cylinder; a transistor having a semiconductor body constituting one transistor region and at least two electrodes carried on respective opposite sides of said semiconductor body and constituting two other transistor regions, said transistor being mounted in said carrier plate so that said plate directly contacts said semiconductor body and is isolated from said electrodes; and a heat-conductive material plastic at room temperatures positioned between said casing and said cooling cylinder for conducting heat generated in said semiconductor body from said plate to said casing.

3. A transistor assembly comprising in combination: a casing; a heat-conductive carrier member within said casing, said carrier member comprising a carrier plate and a cooling cylinder, said cooling cylinder being hollow and said carrier plate mounted therein so that good thermal contact is attained between said cooling cylinder and said carrier plate; a transistor having a semiconductor body constituting one transistor region and at least two electrodes carried on respective opposite sides of said semiconductor body and constituting two other transistor regions, said transistor being mounted in said plate so that said plate directly contacts said semiconductor body and is isolated from said electrodes; and a heat-conductive material plastic at room temperatures positioned between said casing and said cooling cylinder for conducting heat generated in said semiconductor body from said carrier member to said casing.

4. A transistor assembly comprising in combination: a metallic casing; a heat-conductive carrier base within said metallic casing; a transistor having a semiconductor body constituting one transistor region and at least two electrodes carried on respective opposite sides of said semiconductor body and constituting two other transistor regions, said transistor being mounted in said carrier base so that said base directly contacts said semiconductor body and is isolated from said electrodes; and a heat-conductive material plastic at room temperatures positioned between said metallic casing and said base for conducting heat generated in said semiconductor body from said base to said casing.

5. A transistor assembly comprising in combination: a glass casing; a heat-conductive carrier base within said glass casing; a transistor having a semiconductor body constituting one transistor region and at least two electrodes carried on respective opposite sides of said semiconductor body and constituting two other transistor regions, said transistor being mounted in said carrier base so that said base directly contacts said semiconductor body and is isolated from said electrodes; and a heat-conductive material plastic at room temperatures positioned between said glass casing and said base for conducting heat generated in said semiconductor body from said base to said glass casing.

6. A transistor assembly comprising: a tubular glass casing closed at one end and open at the other end; a heat-conductive carrier member within said tubular casing; a transistor having a semiconductor body constituting one transistor region and at least two electrodes carried on respective opposite sides of said semiconductor body and constituting two other transistor regions, said transistor being mounted in said carrier member so that said member directly contacts said semiconductor body and is isolated from said electrodes; and a heat-conductive material plastic at room temperatures positioned between said casing and said carrier member for conducting heat generated in said semiconductor body from said carrier member to said casing.

7. A transistor assembly comprising: a tubular glass casing closed at one end and open at the other end, the open end of said casing being tapered to flare outwardly; a heat-conductive carrier member within said tubular casing; a transistor having a semiconductor body constituting one transistor region and at least two electrodes carried on respective opposite sides of said semiconductor body and constituting two other transistor regions, said transistor being mounted in said carrier member so that said carrier member directly contacts said semiconductor body and is isolated from said electrodes; and a heat-conductive material plastic at room temperatures positioned between said casing and said carrier member for conducting heat generated in said semiconductor body from said carrier member to said casing.

8. A transistor assembly comprising: a casing; a heat-conductive carrier member within said casing; a transistor having a semiconductor body constituting one transistor region and at least two electrodes carried on respective opposite sides of said semiconductor body and constituting two other transistor regions, said transistor being mounted in said carrier member so that said member directly contacts said semiconductor body and is isolated from said electrodes; and a metal which is plastic at room temperatures between said casing and said carrier member for conducting heat generated in said semiconductor body from said carrier member to said casing.

9. The transistor of claim 8 with said metal comprising indium.

10. A transistor assembly comprising: a casing; a heat-conductive carrier member within said casing, said carrier member comprising a carrier plate and a cooling cylinder, said cooling cylinder being hollow and said carrier plate being mounted therein to engage the walls of said cylinder so that heat may be conducted from said carrier plate to said cooling cylinder; a transistor having a semiconductor body constituting one transistor region and at least two electrodes carried on respective opposite sides of said semiconductor body and constituting two other transistor regions, said transistor being mounted in said carrier plate so that said plate directly contacts said semiconductor body and is isolated from said electrodes; and a metal alloy comprising indium and tin being positioned between said cooling cylinder and said casing for conducting heat generated in said semiconductor body from said carrier member to said casing.

References Cited by the Examiner

UNITED STATES PATENTS

| | | | |
|---|---|---|---|
| 2,829,422 | 4/1958 | Fuller | 29—25.3 |
| 2,830,238 | 4/1958 | Gudmundsen | 317—235 X |
| 2,842,831 | 7/1958 | Pfann | 29—25.3 |
| 2,903,629 | 9/1959 | Walker | 317—234 |
| 2,931,958 | 4/1960 | Arthur et al. | 317—234 |
| 2,937,324 | 5/1960 | Kroko | 317—234 |
| 2,955,242 | 10/1960 | Parziale | 317—234 |
| 2,998,554 | 8/1961 | Koets et al. | 317—234 |
| 3,036,249 | 5/1962 | Hall | 317—230 |
| 3,142,886 | 8/1964 | Bronson et al. | 317—234 X |

JOHN W. HUCKERT, *Primary Examiner.*

SAMUEL BERNSTEIN, JAMES D. KALLAM, ARTHUR GAUSS, *Examiners.*

A. B. GOODALL, A. S. KATZ, *Assistant Examiners.*